US012633329B2

(12) United States Patent
Nakatsuji et al.

(10) Patent No.: US 12,633,329 B2
(45) Date of Patent: May 19, 2026

(54) MAGNETIC MEMORY ELEMENT

(71) Applicant: The University of Tokyo, Tokyo (JP)

(72) Inventors: Satoru Nakatsuji, Tokyo (JP); Tomoya Higo, Tokyo (JP)

(73) Assignee: The University of Tokyo, Tokyo (JP)

(*) Notice: Subject to any disclaimer, the term of this patent is extended or adjusted under 35 U.S.C. 154(b) by 208 days.

(21) Appl. No.: 18/286,434

(22) PCT Filed: Apr. 12, 2022

(86) PCT No.: PCT/JP2022/017647
§ 371 (c)(1),
(2) Date: Jan. 18, 2024

(87) PCT Pub. No.: WO2022/220251
PCT Pub. Date: Oct. 20, 2022

(65) Prior Publication Data

US 2024/0194235 A1 Jun. 13, 2024

Related U.S. Application Data

(60) Provisional application No. 63/173,579, filed on Apr. 12, 2021.

(51) Int. Cl.
*G11C 11/16* (2006.01)
*G11C 11/18* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .................................................. G11C 11/161
See application file for complete search history.

(56) References Cited

U.S. PATENT DOCUMENTS

2018/0301177 A1 10/2018 Nakatsuji
2019/0348329 A1 11/2019 Shiokawa et al.
(Continued)

FOREIGN PATENT DOCUMENTS

JP 2019-110326 A 7/2019
JP 2020-017662 A 1/2020
(Continued)

OTHER PUBLICATIONS

James M. Taylor, et al."Epitaxial growth, structural characterization, and exchange bias of noncollinear antiferromagnetic Mn3Ir thin films" 2019; Physical Review Materials 3, 074409 (Year: 2019) (Year: 2019).*
(Continued)

*Primary Examiner* — Douglas King
(74) *Attorney, Agent, or Firm* — WHDA, LLP

(57) ABSTRACT

A magnetic memory element includes an antiferromagnetic layer made of a canted antiferromagnet having a magnetic order with a canted magnetic moment, and a contact layer in contact with the antiferromagnetic layer and made of a different material from the canted antiferromagnet. A roughness of an interface between the antiferromagnetic layer and the contact layer is 1.0 nm or less. A spin current flowing through the contact layer is configured to induce a torque to act on the magnetic order of the antiferromagnetic layer, thereby allowing reversal of the magnetic order.

10 Claims, 12 Drawing Sheets

(51) Int. Cl.

| | |
|---|---|
| ***H10B 61/00*** | (2023.01) |
| ***H10N 50/10*** | (2023.01) |
| ***H10N 50/80*** | (2023.01) |
| ***H10N 50/85*** | (2023.01) |
| ***H10N 52/80*** | (2023.01) |

(52) U.S. Cl.
CPC .............. *G11C 11/18* (2013.01); *H10B 61/22* (2023.02); *H10N 50/10* (2023.02); *H10N 50/80* (2023.02); *H10N 50/85* (2023.02); *H10N 52/80* (2023.02)

(56) References Cited

U.S. PATENT DOCUMENTS

| | | | |
|---|---|---|---|
| 2021/0083175 | A1 | 3/2021 | Suda et al. |
| 2021/0375682 | A1 | 12/2021 | Shiokawa et al. |

FOREIGN PATENT DOCUMENTS

| | | | |
|---|---|---|---|
| WO | 2017/018391 | A1 | 2/2017 |
| WO | 2019/045055 | A1 | 3/2019 |
| WO | 2020/166722 | A1 | 8/2020 |

OTHER PUBLICATIONS

International Search Report dated Jul. 12, 2022, issued in counterpart International Application No. PCT/JP2022/017647. (2 pages).

Tsai et al., "Electrical manipulation of a topological antiferromagnetic state", Nature, Apr. 30, 2020, vol. 580, pp. 608-613. Cited in Specification. (20 pages).

Office Action dated Sep. 3, 2024, issued in counterpart JP Application No. 2023-514659, with English translation. (12 pages).

* cited by examiner

MAGNETIC MEMORY ELEMENT

TECHNICAL FIELD

The present invention relates to a magnetic memory element.

BACKGROUND ART

In recent years, ferromagnet-based magnetoresistance memories that can store a magnetization direction as information of "0" and "1" have attracted attention as a typical example of non-volatile memories. Magnetization reversal phenomena using a spin current have been recently discovered as a writing technique and used widely. In particular, applying an electrical current in a multilayer film including a ferromagnet and a non-magnetic heavy metal (such as tungsten (W) and platinum (Pt)) causes the magnetization reversal phenomenon which is called spin-orbit torque magnetization reversal and has been studied actively as a next-generation technology.

To achieve higher-speed magnetoresistance memories, antiferromagnets have been examined as a possible alternative of ferromagnets (e.g., See Non Patent Literature 1). The reason behind this is that a spin response of antiferromagnets is in the terahertz region (picosecond ($10^{-12}$ seconds)) that is two to three orders of magnitude faster than that of ferromagnets, and an interaction between the antiferromagnets is weak, which provides the potential to achieve magnetic devices such as magnetoresistance memories with higher speed and higher density.

CITATION LIST

Non Patent Literature

Non Patent Literature 1: H. Tsai, T. Higo, K. Kondou, T. Nomoto, A. Sakai, A. Kobayashi, T. Nakano, K. Yakushiji, R. Arita, S. Miwa, Y. Otani, S. Nakatsuji, "Electrical manipulation of a topological antiferromagnetic state," Nature, volume 580, pages 608-613 (2020)

SUMMARY OF INVENTION

Technical Problem

Although it has been demonstrated that information can be electrically written into and read from an antiferromagnet-based magnetic memory element just like a ferromagnet-based magnetic memory element, a readout signal from the antiferromagnet-based magnetic memory element is too weak to be of practical use.

The invention has been made in view of the foregoing, and an object of the invention is to enhance a readout signal from an antiferromagnet-based magnetic memory element.

Solution to Problem

A magnetic memory element according to the invention includes an antiferromagnetic layer made of a canted antiferromagnet having a magnetic order with a canted magnetic moment, and a contact layer in contact with the antiferromagnetic layer and made of a different material from the canted antiferromagnet. A roughness of an interface between the antiferromagnetic layer and the contact layer is 1.0 nm or less. A spin current flowing through the contact layer is configured to induce a torque to act on the magnetic order of the antiferromagnetic layer, thereby allowing reversal of the magnetic order.

Advantageous Effects of Invention

According to the invention, a roughness of an interface between an antiferromagnetic layer and a contact layer is 1.0 nm or less. This makes it possible to smooth the interface, increase a spin current to be injected from the contact layer into the antiferromagnetic layer via the interface, and keep optimal magnetic characteristics of the antiferromagnetic layer, leading to enhancement of a readout signal from a magnetic memory element.

DESCRIPTION OF EMBODIMENTS

Exemplary embodiments of the invention will be described below with reference to the accompanying drawings. The same reference signs are used to designate the same or similar elements throughout the drawings. The drawings are schematic, and a relationship between a planar dimension and a thickness and a thickness ratio between members are different from reality. Needless to say, there are portions having different dimensional relationships or ratios between the drawings.

In the embodiments, a multilayer film may be denoted by materials of layers constituting the multilayer film. For example, suppose that a material-b layer is stacked on a material-a layer, and a material-c layer is stacked on the material-b layer, this multilayer film is denoted by "material a/material b/material c."Furthermore, a material name of each layer may be followed by a thickness (nm) of the layer, placed in parentheses. For example, a material-j layer with a thickness of ti (nm) is denoted by "material j (ti)."

Figure 1:
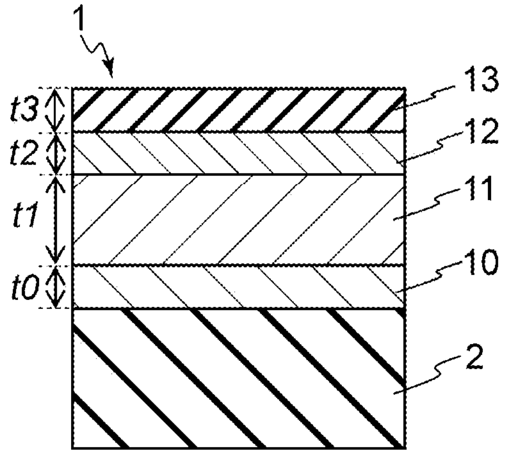
FIG. 1 is a cross-sectional view of a conventional magnetic memory element.

First, a configuration of a conventional antiferromagnet-based magnetic memory element 1 (See Non Patent Literature 1) will be explained with reference to FIG. 1. The magnetic memory element 1 includes a substrate 2, a metal layer 10 on the substrate 2, an antiferromagnetic layer 11 on the metal layer 10, a heavy metal layer 12 on the antiferromagnetic layer 11, and an oxide layer 13 on the heavy metal layer 12.

The substrate 2 is made of an insulating material such as $Si/SiO_2$. The metal layer 10 is made of a metal such as ruthenium (Ru). The antiferromagnetic layer 11 is made of an antiferromagnet such as $Mn_3Sn$. The heavy metal layer 12 is made of a non-magnetic heavy metal such as tantalum (Ta), tungsten (W), and platinum (Pt). The oxide layer 13 is a capping layer to prevent the oxidation and made of a metal oxide such as aluminum oxide (AlOx) and magnesium oxide (MgO).

Now, thicknesses (nm) of the metal layer 10, the antiferromagnetic layer 11, the heavy metal layer 12, and the oxide layer 13 are denoted by t0, t1, t2, and t3, respectively. For example, the magnetic memory element 1 includes a multilayer film of $$Ru(t0)/Mn_3Sn(t1)/W(t2)/AlOx(t3)=Ru(2)/Mn_3Sn(40)/W(5)/AlOx(5).$$

For example, to fabricate the magnetic memory element 1, Ru layer (metal layer 10) and $Mn_3Sn$ layer (antiferromagnetic layer 11) are deposited on the substrate 2 at room temperature, and then the stack is annealed at a predetermined temperature (e.g., 450° C.) for a predetermined time (e.g., 30 minutes), and then the heavy metal layer 12 and the oxide layer 13 are stacked at room temperature.

If it were not for the Ru layer, annealing after deposition of the $Mn_3Sn$ layer causes the $Mn_3Sn$ layer to be crystallized, and thus an interface between the $Mn_3Sn$ layer and the heavy metal layer 12 is roughened, which makes it difficult to drive a device for the magnetic memory element 1. This is why the conventional magnetic memory element 1 includes the Ru layer between the substrate 2 and the $Mn_3Sn$ layer.

When a write current flows through the heavy metal layer 12 of the magnetic memory element 1 in an in-plane direction, a spin Hall effect induces a spin-orbit torque (SOT) to act on a magnetic order of the antiferromagnetic layer 11, thereby allowing reversal of a direction of the magnetic order.

Next, a magnetic memory element of the embodiments will be explained. Unlike the conventional magnetic memory element 1, the magnetic memory element of the embodiments does not include the Ru layer and is fabricated by an improved annealing process as described later.

Figure 2A:
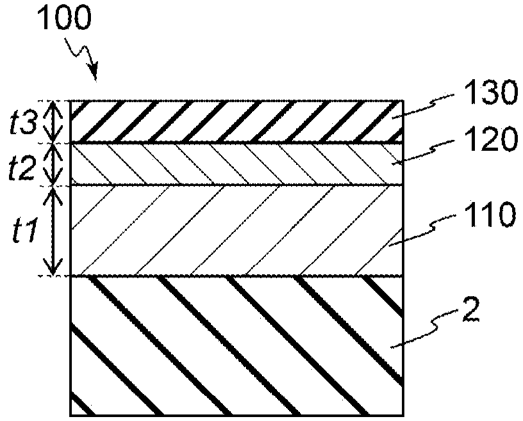
FIG. 2A is a cross-sectional view of a magnetic memory element according to embodiments of the invention.

As shown in FIG. 2A, a magnetic memory element 100 of the embodiments includes a substrate 2, an antiferromagnetic layer 110 that is made of an antiferromagnet and stacked on the substrate 2, a heavy metal layer 120 that is a thin film made of a non-magnetic heavy metal and stacked on the antiferromagnetic layer 110, and an oxide layer 130 on the heavy metal layer 120. Another magnetic memory element 102 shown in FIG. 2B may be employed. In the magnetic memory element 102, a heavy metal layer 120 is stacked on a substrate 2, an antiferromagnetic layer 110 is stacked on the heavy metal layer 120, and an oxide layer 130 is stacked on the antiferromagnetic layer 110.

Although the heavy metal layer 120 is shown as a typical example of a contact layer in contact with the antiferromagnetic layer 110 in the embodiments, another contact layer may be employed which is made of other metal or metal oxide, or a chalcogenide material such as a topological insulator. The embodiments are applicable as long as the contact layer is disposed on at least one surface of the antiferromagnetic layer 110.

Next, characteristics of $Mn_3Sn$ will be explained as an example of an antiferromagnet constituting the antiferromagnetic layer 110 with reference to FIG. 3.

Figure 3:
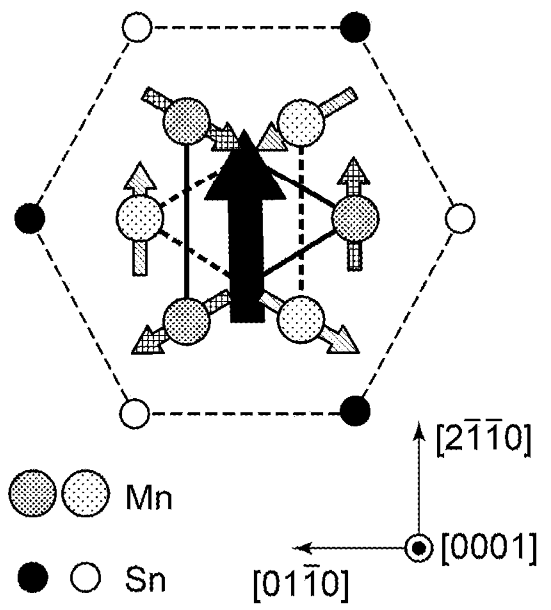
FIG. 3 is a schematic view of crystal and magnetic structures of $Mn_3Sn$.

$Mn_3Sn$ is an antiferromagnet having a crystal structure called kagome lattice that is a triangle-based lattice in which kagome lattice layers are stacked in direction as shown in FIG. 3. Manganese (Mn) atoms located at vertices of kagome lattice have a non-collinear magnetic structure in which magnetic moments (directions of localized spins) are oblique to each other by 120 degrees at temperature of 420 K or below due to geometrical frustration. A unit of six spins consisting of two sets of three spins residing on a kagome lattice bilayer forms a spin order called a cluster magnetic octupole depicted as hexagon. Such a non-collinear magnetic structure can be viewed as ferroic order of the cluster magnetic octupole (thick arrow in the central part of FIG. 3). This ferroic order breaks the time-reversal symmetry macroscopically.

The cluster magnetic octupole corresponds to a direction of a fictitious magnetic field in a momentum space (100 to 1000 Tesla (T) in a real space) and Weyl points which have a topological electronic structure. Hence, it is possible to manipulate the responses originating from the fictitious magnetic field and Weyl points based on the direction of the cluster magnetic octupole.

The magnetic structure shown in FIG. 3 has orthorhombic symmetry, and one of the three magnetic moments of Mn atoms which are triangularly arranged is parallel to an easy axis of magnetization. The other two magnetic moments are canted with respect to the easy axis of magnetization, and thus are believed to induce a weak ferromagnetic moment. Such an antiferromagnet having a canted magnetic moment to exhibit a tiny magnetization is called a canted antiferromagnet.

Figure 2B:
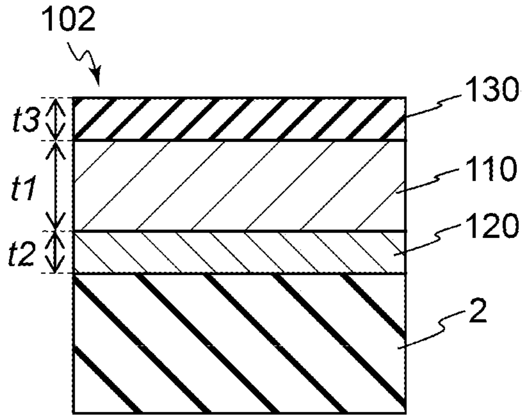
FIG. 2B is a cross-sectional view of a magnetic memory element according to a modification of the embodiments.

The crystal orientation of $Mn_3Sn$ plays an important role in enhancement of a readout signal from the magnetic memory element. For example, in an anomalous Hall effect measurement, only crystal grains having an out-of-plane component of the magnetic order of the cluster magnetic octupole (i.e., a component perpendicular to a surface of the substrate 2) contribute to a Hall voltage. However, like the conventional magnetic memory element 1 (FIG. 1), the insertion of the Ru layer (metal layer 10) forces the kagome planes of $Mn_3Sn$ near the Ru layer to be aligned in a nearly in-plane direction (i.e., a direction nearly parallel to the surface of the substrate 2), which leads to a reduction in the contribution to the Hall voltage. An electrical current flowing through the Ru layer is another factor for a reduction in a readout voltage. Therefore, in the embodiments, the magnetic memory elements 100 and 102 do not include the Ru layer as shown in FIGS. 2A and 2B so that the $Mn_3Sn$ layer has the crystal orientation to produce a larger Hall voltage.

As described earlier, without the Ru layer, assuming that annealing is carried out after the deposition of the $Mn_3Sn$ layer (antiferromagnetic layer 110) followed by depositing the heavy metal layer 120, the $Mn_3Sn$ layer is crystallized, and thus the interface between the $Mn_3Sn$ layer and the heavy metal layer 120 is roughened. Hence, in the embodiments, annealing is not carried out immediately after the deposition of the $Mn_3Sn$ layer, but is carried out after the deposition of all layers of the multilayer film.

A method for fabricating the magnetic memory element 100 of the embodiments will be explained by providing examples of forming $Mn_3Sn$/W/AlOx and forming $Mn_3Sn$/Ta/AlOx, on a Si/$SiO_2$ substrate.

As for $Mn_3Sn$/W/AlOx, the $Mn_3Sn$ layer is deposited on the Si/$SiO_2$ substrate at room temperature using a DC magnetron sputtering device with a base pressure of less than $5\times10^{-7}$ Pa. Next, the W layer is deposited at room temperature using a molecular beam epitaxy (MBE) device under ultrahigh vacuum with a base pressure of less than $2\times10^{-8}$ Pa. Note that the W layer can be deposited using a DC magnetron sputtering device as well. Subsequently, the AlOx layer is deposited at room temperature using an RF magnetron sputtering device with a base pressure of less than $5\times10^{-7}$ Pa. All the layers are deposited without breaking vacuum. After the deposition of $Mn_3Sn$/W/AlOx stack, the stack is annealed at a predetermined temperature (e.g., 450° C.) for a predetermined time (e.g., 30 minutes). Thus, the magnetic memory element 100 is fabricated.

As for $Mn_3Sn$/Ta/AlOx, the $Mn_3Sn$ layer and the Ta layer are deposited on the Si/$SiO_2$ substrate using a DC magnetron sputtering device with a base pressure of less than $5\times10^{-7}$ Pa, and the AlOx layer is deposited using an RF magnetron sputtering device. All the layers are deposited at room temperature without breaking vacuum. After the deposition of $Mn_3Sn$/Ta/AlOx stack, the stack is annealed at a predetermined temperature (e.g., 500° C.) for a predetermined time (e.g., 30 minutes). Thus, the magnetic memory element 100 is fabricated.

In this way, the magnetic memory element 100 of the embodiments is fabricated by annealing at not less than crystallization temperature of the antiferromagnetic layer 110 after the deposition of all the layers of the multilayer film including the antiferromagnetic layer 110. The magnetic memory element 102 shown in FIG. 2B is also fabricated by a similar method.

By fabricating the magnetic memory elements 100 and 102 using the improved annealing process, the interface between the antiferromagnetic layer 110 and the contact layer in contact with the antiferromagnetic layer 110 can be smoothed without the Ru layer, and thus the enhancement of the readout signal is expectable.

While the focus below is on the magnetic memory element 100 shown in FIG. 2A unless noted otherwise, the following explanation can be applied to the magnetic memory element 102 shown in FIG. 2B as well.

Next, the anomalous Hall effect, a write operation, and a read operation of the magnetic memory element 100 will be explained with reference to FIGS. 4A to 4C.

Figure 4A:
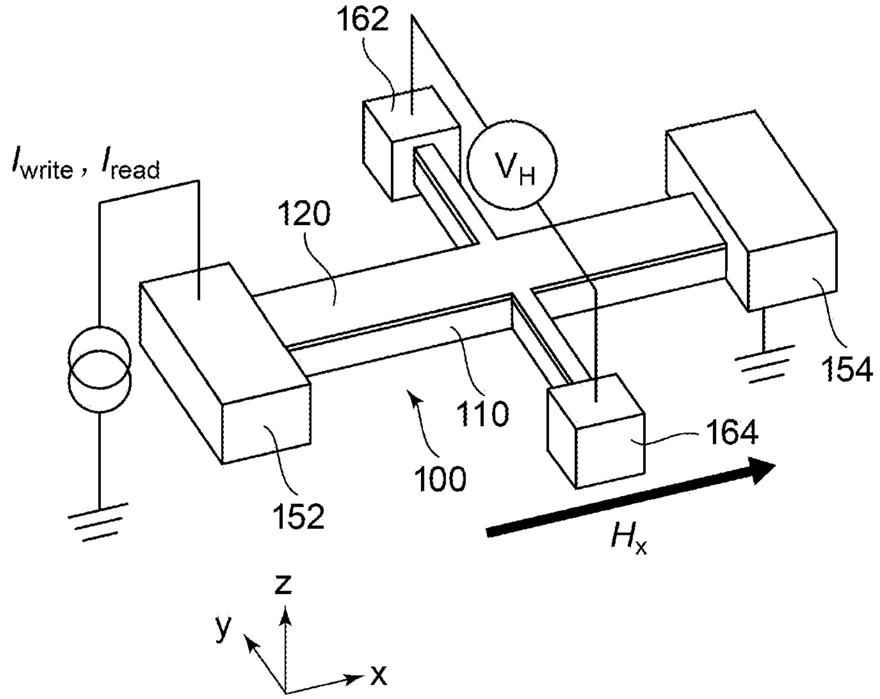
FIG. 4A is a schematic view illustrating a configuration of a magnetic memory element with a Hall bar structure.

FIG. 4A shows a configuration of the magnetic memory element 100 with a Hall bar structure. A sample of the magnetic memory element 100 is fabricated with a predetermined size (e.g., 16 μm×96 μm). A pair of electrodes 152 and 154 made of Au/Ti is disposed on both ends of the sample in a longitudinal direction (x-direction), and a pair of electrodes 162 and 164 made of Au/Ti is disposed in a short direction (y-direction). A write current $I_{write}$ or a read current $I_{read}$ flows between the electrodes 152 and 154, and a Hall voltage $V_H$ is detected between the electrodes 162 and 164. The substrate 2 and the oxide layer 130 are omitted in FIG. 4A.

Figure 4B:
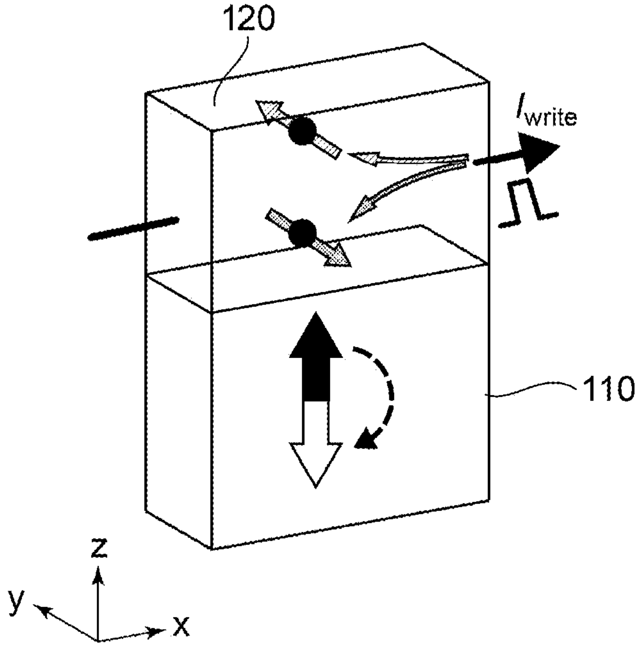
FIG. 4B is an illustrative diagram of a write operation in the magnetic memory element shown in FIG. 4A.

To write information into the magnetic memory element 100, the write current $I_{write}$ (pulse current) flows through the heavy metal layer 120 in the longitudinal direction (x-direction) as shown in FIG. 4B. This write current generates a spin current in an out-of-plane direction (z-direction) by the spin Hall effect, and this spin current induces an SOT to act on the magnetic order of the antiferromagnetic layer 110, thereby allowing reversal of the magnetic order. Here, a weak bias field Hx applying in x-direction affects the magnetic order of the antiferromagnetic layer 110, and determines a rotational direction of the magnetic order.

In this way, the information ("0" or "1") can be written into the antiferromagnetic layer 110. The direction of the magnetic order of the antiferromagnetic layer 110 can be manipulated depending on the direction of the write current $I_{write}$. For example, the write current $I_{write}$ flowing in +x-direction reverses the magnetic order from +z-direction ("1") to −z-direction ("0"), and the write current $I_{write}$ flowing in −x-direction reverses the magnetic order from −z-direction ("0") to +z-direction ("1").

Figure 4C:
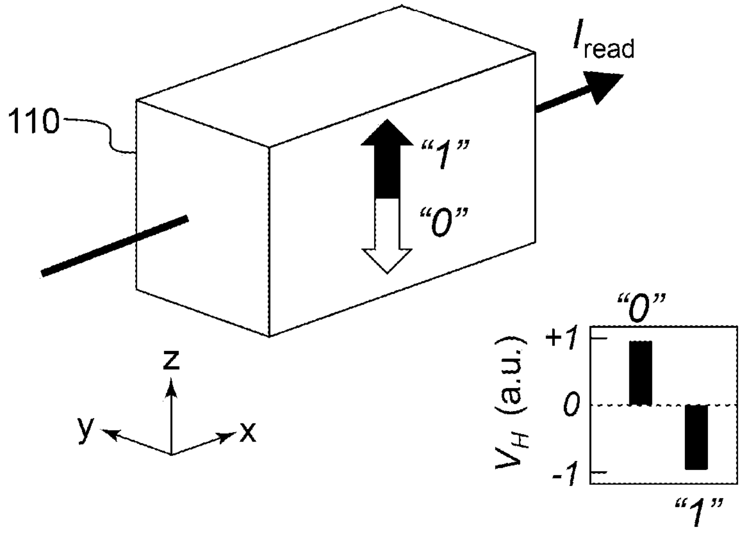
FIG. 4C is an illustrative diagram of a read operation in the magnetic memory element shown in FIG. 4A.

To read out the information stored in the antiferromagnetic layer 110, the read current $I_{read}$ (direct current) flows through the antiferromagnetic layer 110 in x-direction as shown in FIG. 4C. This read current generates the Hall voltage $V_H$ in y-direction by the anomalous Hall effect. The sign of the Hall voltage $V_H$ is determined depending on the z-direction component of the magnetic order of the antiferromagnetic layer 110. For example, +z-direction and −z-direction of the magnetic order of the antiferromagnetic layer 110 are equivalent to "1" and "0," respectively. In this way, by the read current $I_{read}$ flowing through the antiferromagnetic layer 110, the information stored depending on the direction of the magnetic order of the antiferromagnetic layer 110 can be read out as the Hall voltage $V_H$.

Next, measurement results of the anomalous Hall effect in the conventional magnetic memory element 1 and the magnetic memory element 100 of the embodiments will be explained with reference to FIGS. 5A to 5D and 6. Here, the multilayer films of the magnetic memory element 1 and the magnetic memory element 100 used for the measurements are Ru(2)/$Mn_3Sn$(40)/W(5) and $Mn_3Sn$(40)/W(5), respectively.

Figure 5A:
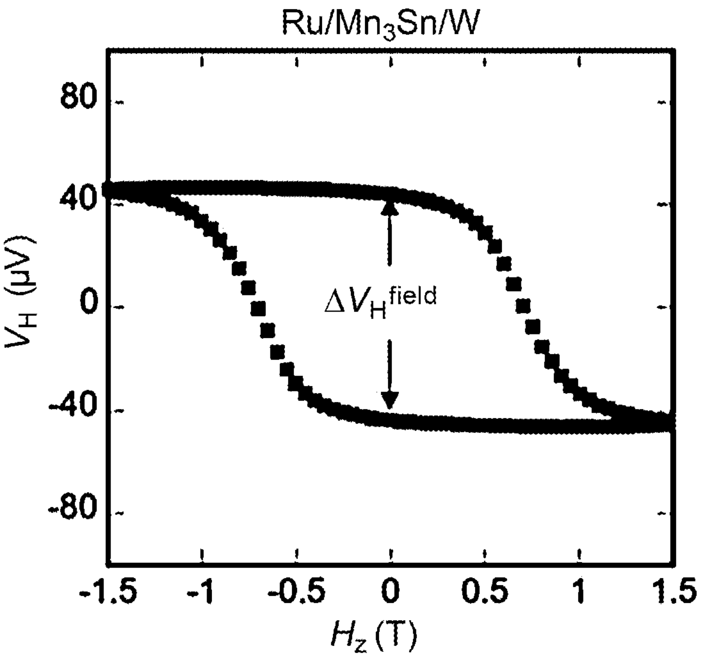
FIG. 5A is a graph of perpendicular magnetic field dependence of a Hall voltage for a conventional Ru/$Mn_3Sn$/W film.
Figure 5B:
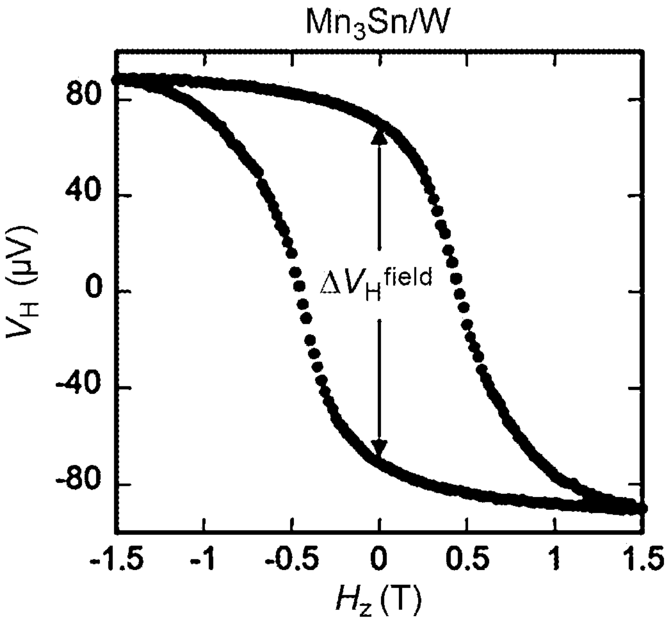
FIG. 5B is a graph of perpendicular magnetic field dependence of a Hall voltage for a $Mn_3Sn$/W film of the embodiments.

FIGS. 5A and 5B show the Hall voltage $V_H$ as a function of a perpendicular magnetic field Hz (magnetic field in the out-of-plane direction) for Ru/$Mn_3Sn$/W and $Mn_3Sn$/W films, respectively, measured when the read current $I_{read}$ Of 0.2 mA is applied to these films under the perpendicular magnetic field Hz. As shown in FIGS. 5A and 5B, a clear hysteresis of the Hall voltage $V_H$ is observed in both samples. The difference $\Delta V_H^{field}$ in the Hall voltage $V_H$ at zero magnetic field (hereinafter referred to as Hall voltage change) in the $Mn_3Sn$/W film is found to be about 140 uV which is about 1.6 times larger than the Hall voltage change in the Ru/$Mn_3Sn$/W film.

Figure 5C:
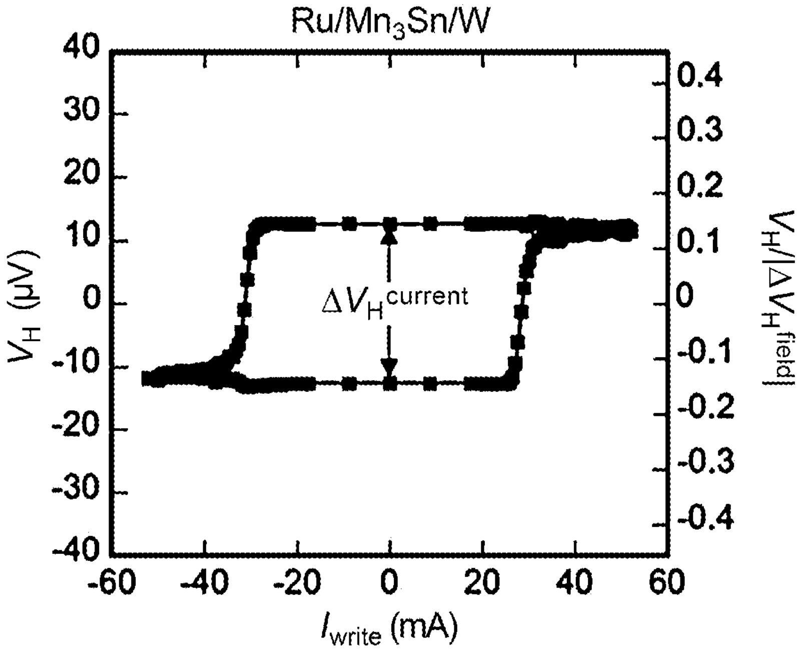
FIG. 5C is a graph of write current dependence of the Hall voltage for the Ru/$Mn_3Sn$/W film.
Figure 5D:
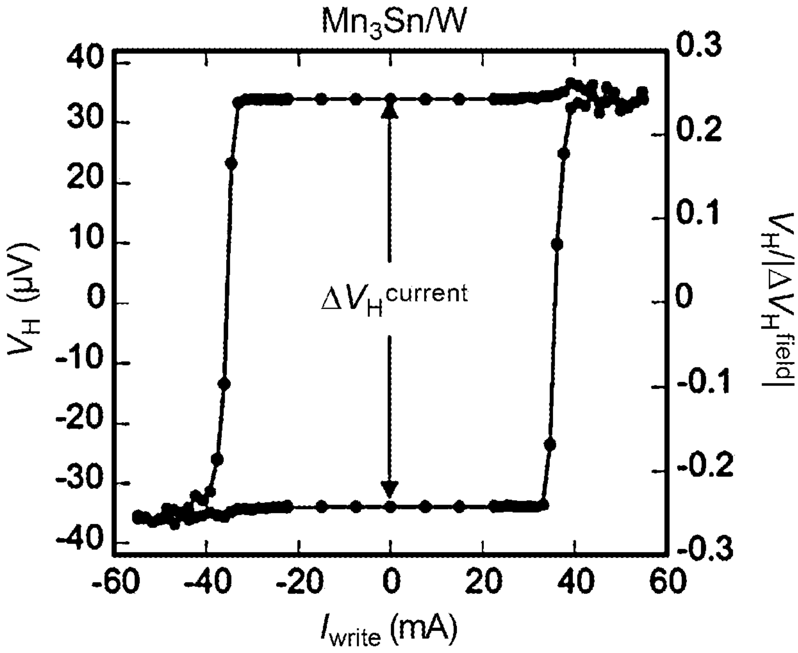
FIG. 5D is a graph of write current dependence of the Hall voltage for the $Mn_3Sn$/W film.

FIGS. 5C and 5D show the Hall voltage $V_H$ as a function of the write current $I_{write}$ at room temperature under the bias field of $\mu_0Hx=0.1$ T along the electrical current direction (x-direction) for the Ru/$Mn_3Sn$/W and $Mn_3Sn$/W films, respectively. To measure the Hall voltage $V_H$, the read current $I_{read}$ of 0.2 mA is also applied after the write current $I_{write}$ is applied.

FIG. 5C suggests that the Hall voltage change $\Delta V_H^{current}$ of about 25 µV appears under the write current $I_{write}$ in the Ru/$Mn_3Sn$/W film. This behavior indicates that the spin current generated in the W layer by the write current $I_{write}$ flowing through the magnetic memory element 1 reverses the Hall voltage $V_H$ originating from the fictitious magnetic field and the cluster magnetic octupole of $Mn_3Sn$ (i.e., the spin current induces the spin-orbit torque and causes the reversal). Here, from FIGS. 5A and 5C, a ratio $\Delta V_H^{current}/\Delta V_H^{field}$ in the Ru/$Mn_3Sn$/W film is found to be about 0.29.

FIG. 5D suggests that the Hall voltage change $\Delta V_H^{current}$ of about 70 µV appears under the write current $I_{write}$ in the $Mn_3Sn$/W film, indicating that the readout signal of the $Mn_3Sn$/W film is about three times larger than that of the Ru/$Mn_3Sn$/W film. From FIGS. 5B and 5D, the ratio $\Delta V_H^{current}/\Delta V_H^{field}$ in the $Mn_3Sn$/W film is found to be about 0.5, indicating an increase in the ratio of switching of the magnetic order from about 29% in the Ru/$Mn_3Sn$/W film to about 50% in the $Mn_3Sn$/W film. Therefore, it is possible to electrically manipulate a larger readout signal (Hall voltage) in the $Mn_3Sn$/W film than that in the Ru/$Mn_3Sn$/W film.

Figure 6:
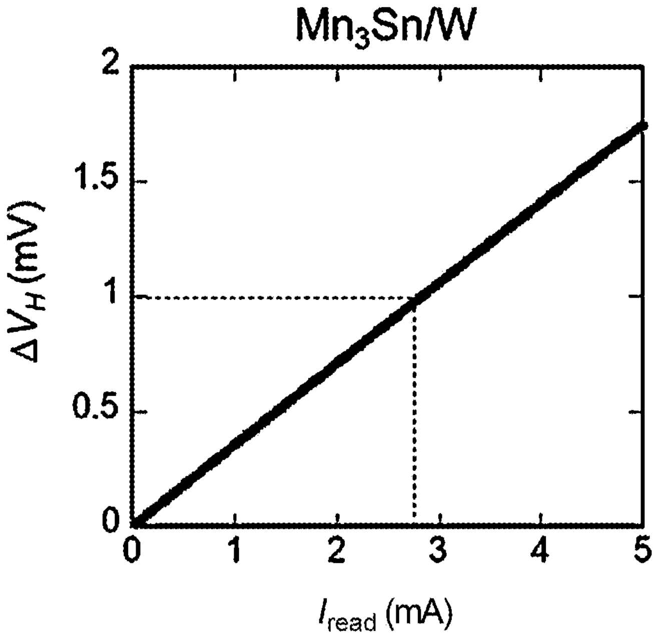
FIG. 6 is a graph of read current dependence of a Hall voltage change for the $Mn_3Sn$/W film.

Since (Hall voltage $V_H$)=(read current $I_{read}$)×(Hall resistance $R_H$), the Hall voltage $V_H$ increases in proportion to the read current $I_{read}$. As shown in FIG. 6, the Hall voltage $V_H$ of 1 mV is found to be obtained in the $Mn_3Sn$/W film under the read current $I_{read}$ of about 3 mA which is one-tenth of the write current $I_{write}$, without the influence of temperature rise of the magnetic memory element 100.

Figure 7:
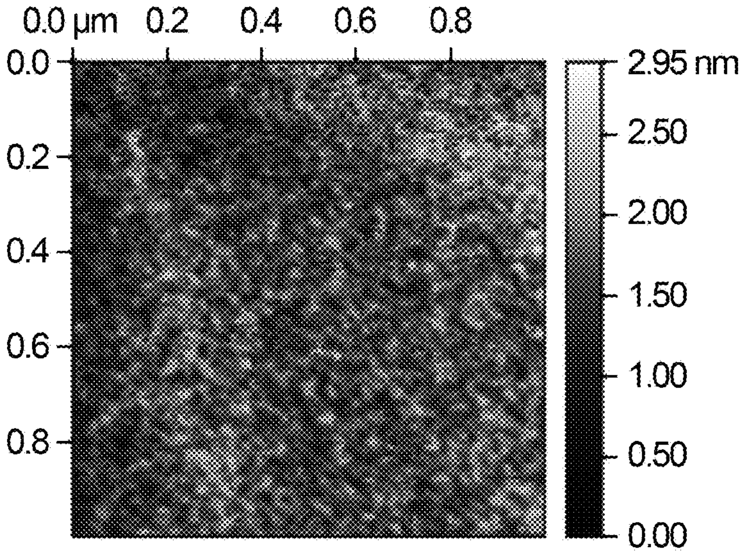
FIG. 7 is an atomic force microscope (AFM) image of the $Mn_3Sn$/W film.

To examine the interface condition between the $Mn_3Sn$ and W layers, atomic force microscope (AFM) measurements are made. The surface condition of the $Mn_3Sn$/W film obtained by the AFM measurements reflects the interface condition between the $Mn_3Sn$ and W layers. FIG. 7 shows an AFM image of the $Mn_3Sn$(40)/W(5) film with the Hall bar structure. A root mean square (RMS) roughness of an AFM image is defined as Equation (1).

$$\mathrm{RMS} = \frac{1}{N}\sqrt{\sum_i (x_i - x_M)^2} \tag{1}$$

Here, N is the number of pixels of the AFM image, $x_i$ is a height of the i-th pixel, and $x_M$ is a mean height. From the AFM image of FIG. 7, the RMS roughness of the $Mn_3Sn$/W film is found to be about 0.5 nm, which is one order of magnitude smaller than that of the conventional Ru/$Mn_3Sn$/W film. This indicates that the interface between the $Mn_3Sn$ and W layers is smoothed.

As described above, the enhancement of the readout signal from the magnetic memory element 100 with the $Mn_3Sn$/W multilayer film is attributed to the following main factors: (i) Removal of the Ru layer causes the crystal grains of the $Mn_3Sn$ layer to be aligned in the out-of-plane direction which allows an increase in the readout signal; and (ii) Annealing after the deposition of all the layers of the multilayer film causes the roughness of the interface between the $Mn_3Sn$ and W layers to be 1.0 nm or less, which indicates the smooth interface.

Next, results of various measurements (X-ray diffraction, RMS roughness, and anomalous Hall effect) on the magnetic memory element 100 or 102 of the embodiments in a case where the heavy metal layer 120 is made of Ta will be explained with reference to FIGS. 8 to 12.

X-ray Diffraction

Figure 8:
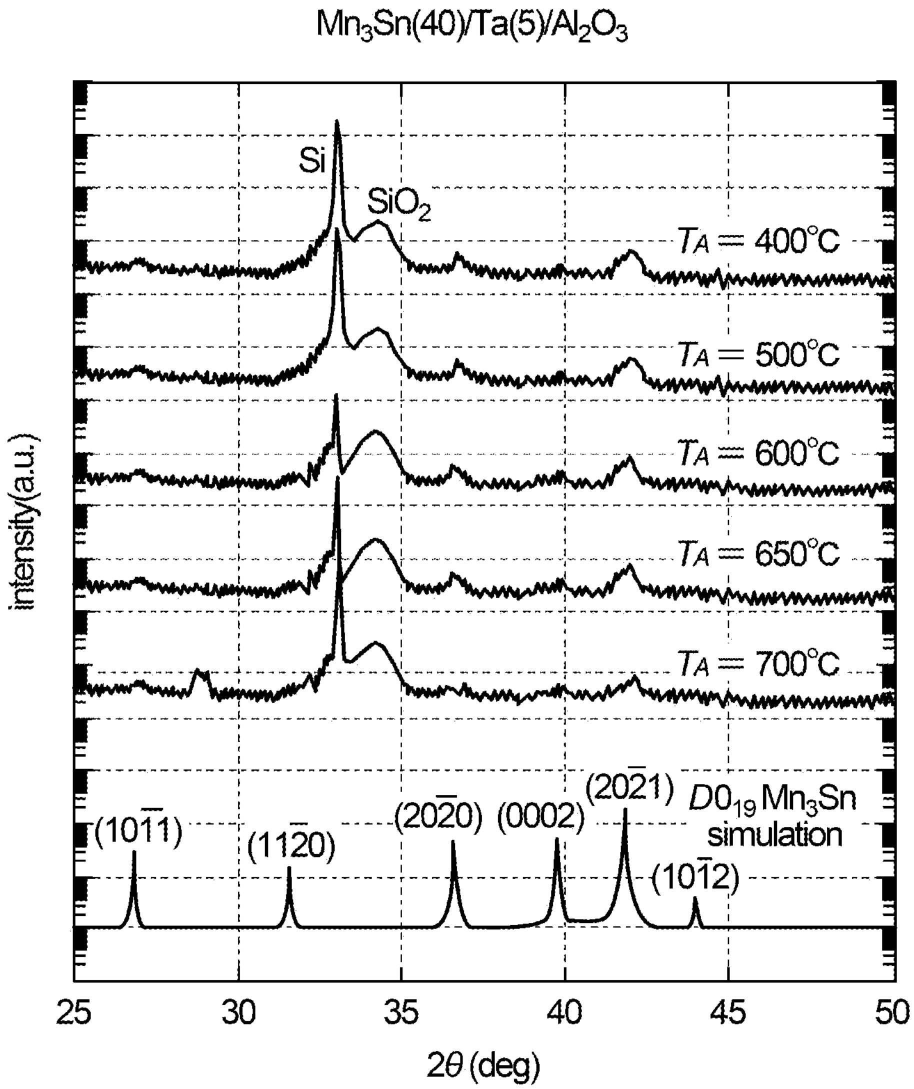
FIG. 8 is a graph of X-ray diffraction patterns of $Mn_3Sn$/Ta/$Al_2O_3$ films of the embodiments fabricated at different annealing temperatures $T_A$.

As described earlier, the magnetic memory element 100 is fabricated by annealing after the deposition of all the layers of the multilayer film. FIG. 8 shows X-ray diffraction patterns of $Mn_3Sn(40)/Ta(5)/Al_2O_3$ films deposited on a substrate ($Si/SiO_2$) at different annealing temperatures $T_A$ (400° C., 500° C., 600° C., 650° C., and 700° C.).

FIG. 8 suggests that when 400° C.≤$T_A$≤650° C., all peaks of the X-ray diffraction patterns can be attributed to $Mn_3Sn$ or the substrate ($Si/SiO_2$), indicating that reaction between the $Mn_3Sn$ and Ta layers is negligible and that the $Mn_3Sn$ layer is of single phase. In contrast, at $T_A$=700° C., a peak appears around 29° that is found to be not associated with any crystalline orientation in $Mn_3Sn$. Any Mn—Ta, Sn—Ta, or Mn—Ta—Sn compounds that have a major peak at this angle are not found.

RMS Roughness

Figure 9:
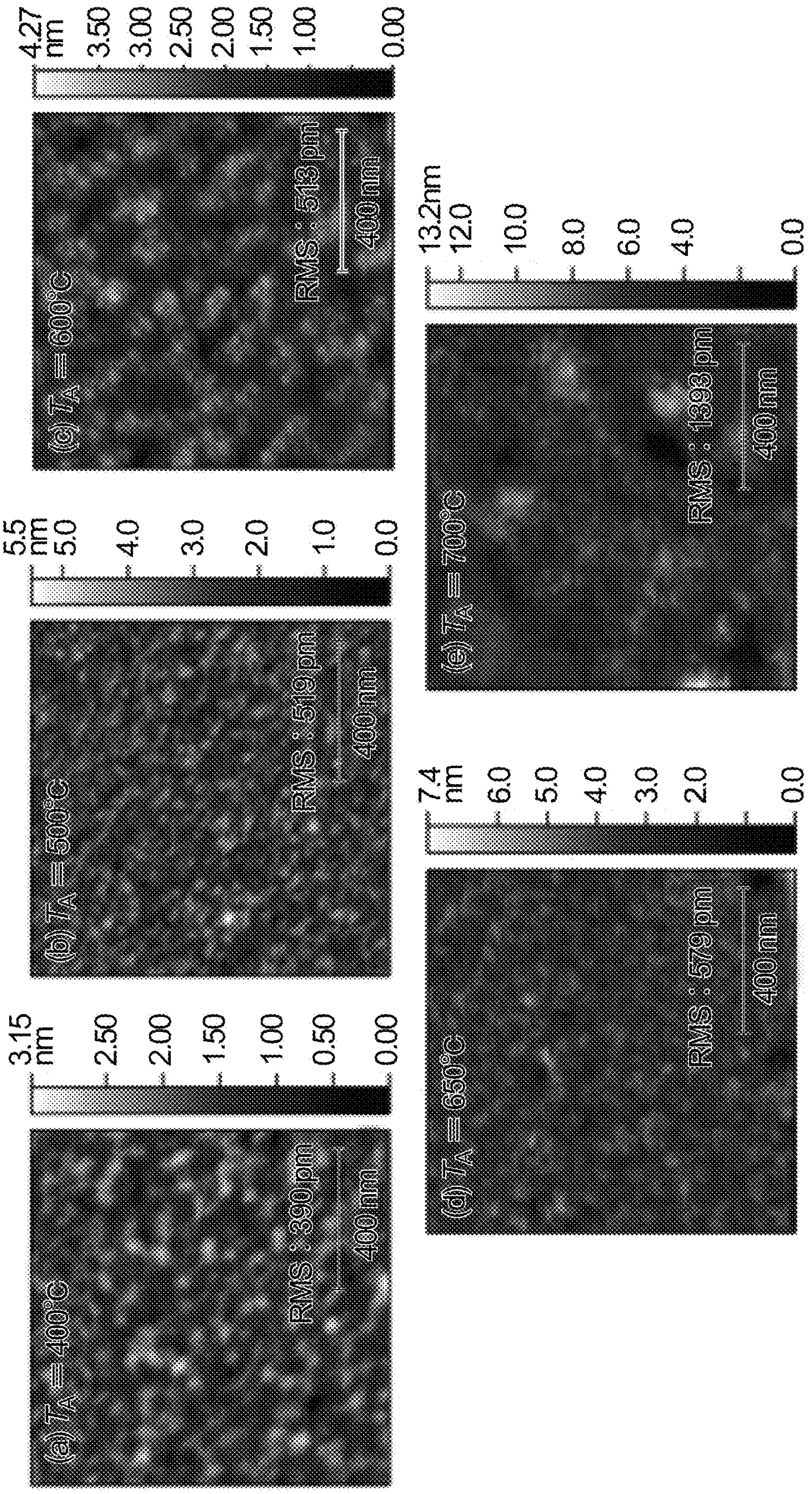
FIG. 9 is AFM images of $Mn_3Sn$/Ta/$Al_2O_3$ films fabricated at different annealing temperatures $T_A$.

FIG. 9 shows AFM images ((a) to (e)) of the $Mn_3Sn(40)/Ta(5)/Al_2O_3$ films fabricated at different annealing temperatures $T_A$ (400° C., 500° C., 600° C., 650° C., and 700° C.). FIG. 9 suggests that when 400° C.≤$T_A$≤650° C. (images (a) to (d)), the RMS roughness increases slightly with an increase in $T_A$ from about 0.4 nm to about 0.6 nm. In contrast, at $T_A$=700° C. (image (e)), there is a sharp rise in the RMS roughness up to about 1.4 nm, suggesting that the reaction between the $Mn_3Sn$ and Ta layers deforms the structure of the film.

Figure 10:
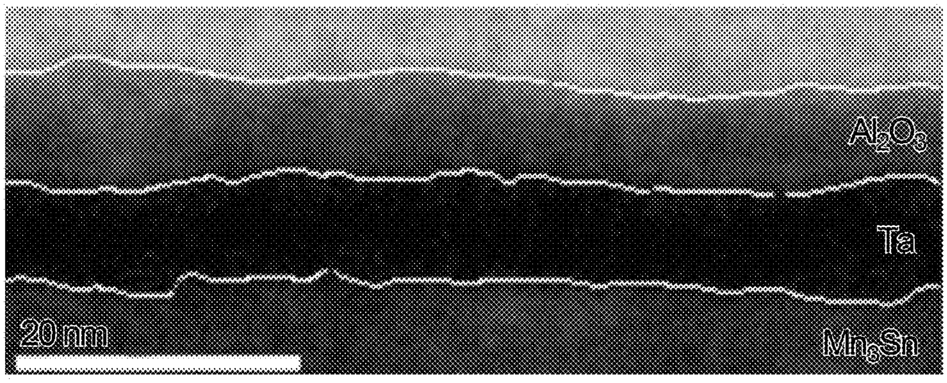
FIG. 10 is a cross-sectional transmission electron microscopy (TEM) image of the $Mn_3Sn$/Ta/$Al_2O_3$ film fabricated at $T_A$=500° C.

FIG. 10 shows a cross-sectional transmission electron microscopy (TEM) image of the $Mn_3Sn(40)/Ta(5)/Al_2O_3$ film fabricated at $T_A$=500° C. The layer boundaries are indicated by solid white lines in FIG. 10. From the TEM image, the RMS roughness of the film surface is found to be about 0.6 nm, while the RMS roughness of the interface between the $Mn_3Sn$ and Ta layers is found to be about 0.5 nm, which is almost consistent with the AFM measurement result shown in FIG. 9 (image (b)).

Anomalous Hall Effect

Figure 11:
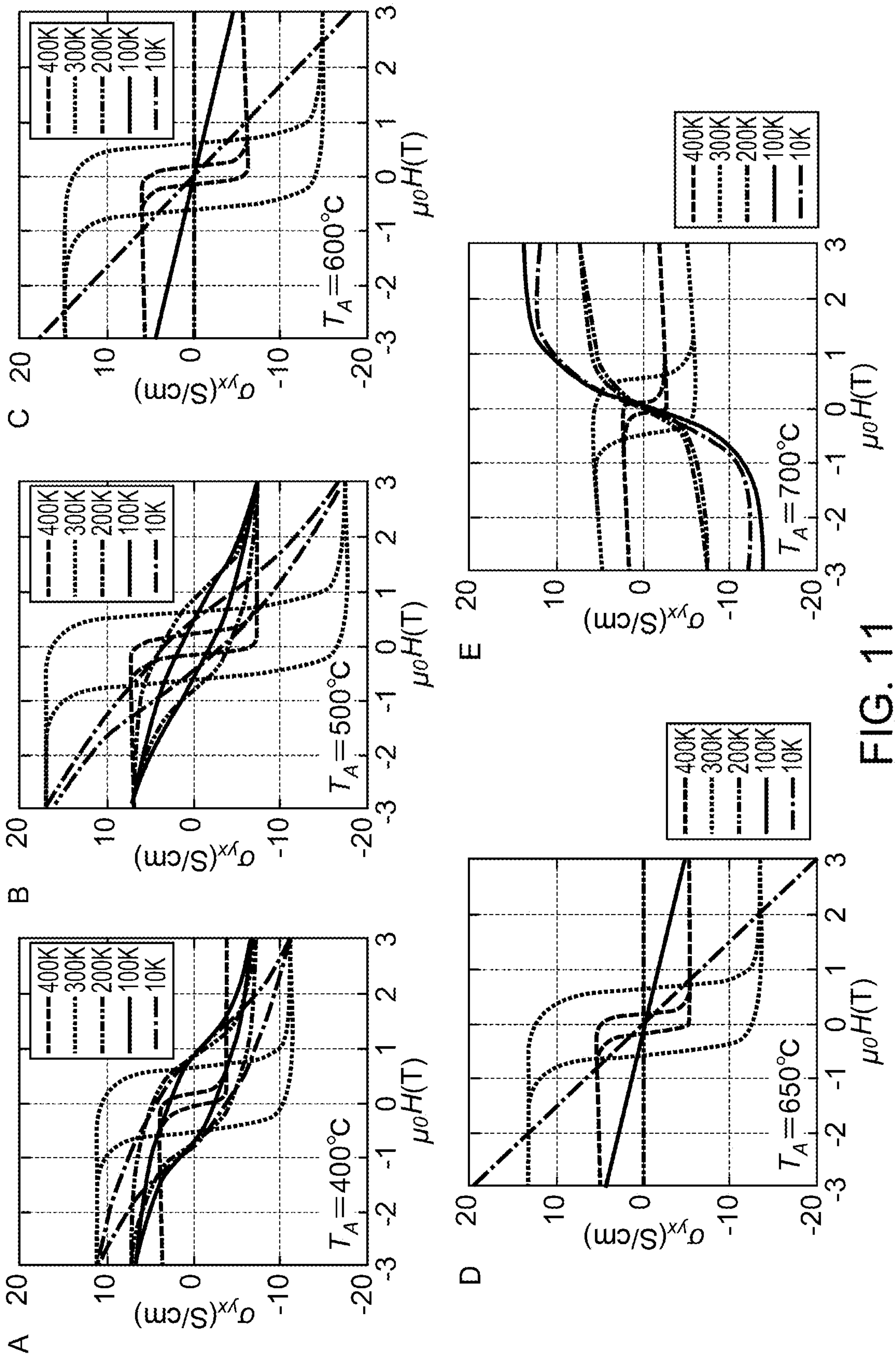
FIG. 11 is graphs of magnetic field dependence of anomalous Hall conductivities for $Mn_3Sn$/Ta/$Al_2O_3$ films fabricated at different annealing temperatures $T_A$.

FIG. 11 shows magnetic field dependence of anomalous Hall conductivities $\sigma_{yx}=-\rho_H/\rho^2$ (S/cm) for $Mn_3Sn(40)/Ta(5)/Al_2O_3$ (3) films fabricated at different annealing temperatures $T_A$ (400° C., 500° C., 600° C., 650° C., and 700° C.) (graphs A to E). Here, $\rho_H$ denotes a Hall resistivity ($=V_H\cdot(t1+t2)$) of the $Mn_3Sn(40)/Ta(5)$ layers, and $\rho$ denotes a resistivity of the $Mn_3Sn(40)/Ta(5)$ layers. All films shown in graphs A to E exhibit a finite hysteresis at 300 K. Especially at $T_A$=500° C. (graph B), $\sigma_{yx}$ peaks at zero magnetic field (H=0) and 300K with a value of 18 S/cm. At $T_A$=700° C. (graph E), on the other hand, a sharp decrease in $\sigma_{yx}$ at zero magnetic field and 300K can be seen with a value of 6 S/cm.

To measure the Hall voltage $V_H$ in the $Mn_3Sn/Ta/Al_2O_3$ film of the magnetic memory element 100 with the Hall bar structure shown in FIG. 4A, the write current $I_{write}$ (100 ms pulse current) and the bias field of $\mu_0Hx$=0.1 T are applied to the film in x-direction, followed by the read current $I_{read}$ of 0.2 mA (500 ms pulse current). The Hall voltage $V_H^{field}$ in the $Mn_3Sn/Ta/Al_2O_3$ film under the perpendicular magnetic field Hz is also measured to obtain $\Delta V_H^{field}$ which represents a change in the Hall voltage $V_H$ when the magnetic order of all domains in the $Mn_3Sn$ layer is switched.

Figure 12:
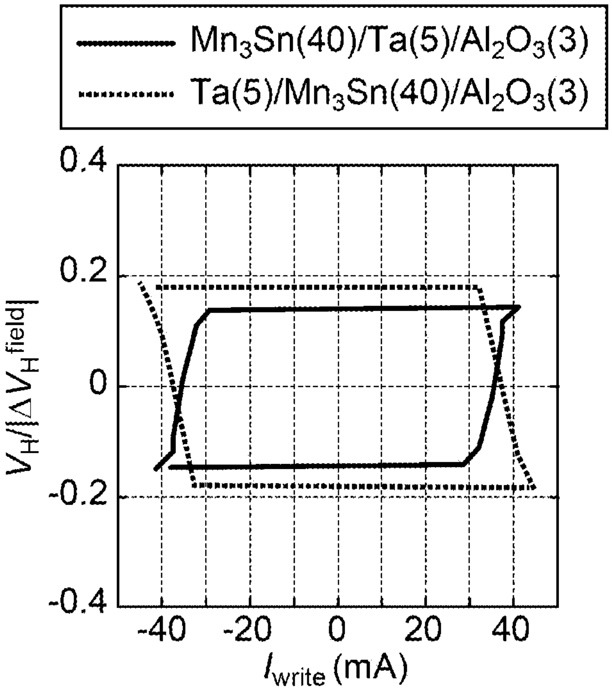
FIG. 12 is a graph of write current dependence of a switching ratio of a magnetic order for $Mn_3Sn$/Ta/$Al_2O_3$ and Ta/$Mn_3Sn$/$Al_2O_3$ films.

FIG. 12 shows a ratio $V_H/|\Delta V_H^{field}|$ as a function of the write current $I_{write}$ for the $Mn_3Sn/Ta/Al_2O_3$ film by solid line. FIG. 12 also shows a ratio $V_H/|\Delta V_H^{field}|$ as a function of the write current $I_{write}$ for a $Ta(5)/Mn_3Sn(40)/Al_2O_3$ (3) film by dotted line. The $Ta/Mn_3Sn/Al_2O_3$ film is fabricated by annealing at 500° C. after deposition of all layers.

The difference between the Hall voltage $V_H$ ($I_{write}$=+0) when the write current $I_{write}$ is swept from positive to negative and the Hall voltage $V_H$ ($I_{write}$=−0) when the write current $I_{write}$ is swept from negative to positive is denoted by $\Delta V_H^{current}$. A ratio $\Delta V_H^{current}/|\Delta V_H^{field}|$ is a switching ratio that indicates a ratio of domains that are actually switched to all switchable domains.

FIG. 12 suggests that the $Mn_3Sn/Ta/Al_2O_3$ and $Ta/Mn_3Sn/Al_2O_3$ films have opposite polarity, and SOTs with opposite directions occur in these films. The switching ratios in both films are found to reach about 40%. Note that the difference $\Delta V_H^{current}$ of the Hall voltage $V_H$ in the $Mn_3Sn/Ta/Al_2O_3$ film is about 70 μV under the read current $I_{read}$ of 0.2 mA, which is about three times larger than the Hall voltage change $\Delta V_H^{current}$ of about 25 μV in the conventional magnetic memory element 1 ($Ru/Mn_3Sn/W$ film).

Thus, to obtain a large readout signal from the $Mn_3Sn/Ta/Al_2O_3$ film, it is desirable that the reaction between the $Mn_3Sn$ and Ta layers be small and the roughness of the interface between the $Mn_3Sn$ and Ta layers be small. Specifically, the roughness of the interface is preferably 1.0 nm or less, more preferably 0.6 nm or less. By making a smooth interface with a small roughness, it is possible to increase a spin current to be injected into the $Mn_3Sn$ layer via the interface and to enhance the readout signal from the $Mn_3Sn$ layer.

The magnetic memory elements of the embodiments can be served as magnetic random-access memory (MRAM) elements. Magnetic memory elements for MRAM will be explained below with reference to FIGS. 13 and 14.

Figure 13:
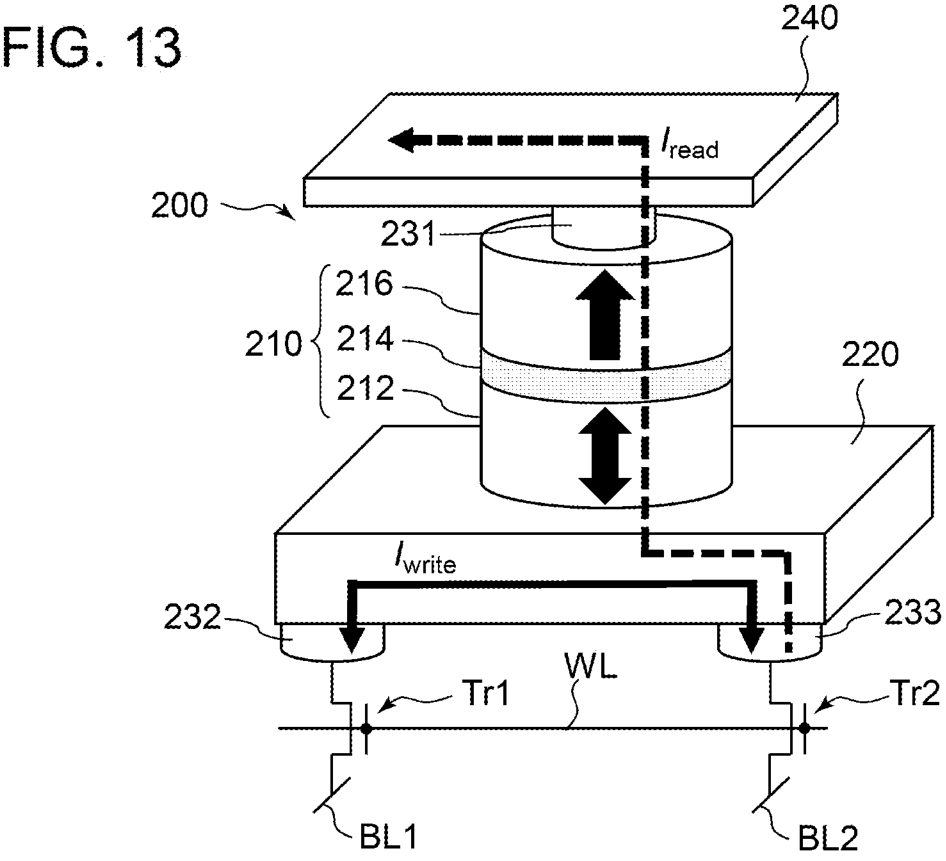
FIG. 13 is a schematic view of a configuration of a magnetic memory element for an SOT-MRAM.

FIG. 13 shows a configuration of a magnetic memory element 200 for an SOT-MRAM. The magnetic memory element 200 includes a magnetoresistance element 210, a heavy metal layer 220, a first terminal 231, a second terminal 232, a third terminal 233, and transistors Tr1 and Tr2.

The heavy metal layer 220 is made of a non-magnetic heavy metal that exhibits a spin Hall effect (such as W and Ta) or made of a chalcogenide material such as a topological insulator. The magnetoresistance element 210 includes a free layer 212 which is in contact with the heavy metal layer 220 and whose magnetic order can be reversed, a non-magnetic layer 214 on the free layer 212, and a reference layer 216 which is in contact with the non-magnetic layer 214 and whose magnetic order is fixed in an out-of-plane direction.

The free layer 212 is a thin film made of a canted antiferromagnet as with the antiferromagnetic layer 110 shown in FIGS. 2A and 2B. The non-magnetic layer 214 is made of an insulating material (e.g., MgO). The reference layer 216 is made of a ferromagnet (e.g., CoFeB). The magnetoresistance element 210 serves as a magnetic tunnel junction (MTJ) element.

The first terminal 231, the second terminal 232, and the third terminal 233 are made of a metal. The first terminal 231 is connected to the reference layer 216, the second terminal 232 is connected to one end portion of the heavy metal layer 220, and the third terminal 233 is connected to the other end portion of the heavy metal layer 220. The first terminal 231 is connected to a ground line 240. The ground line 240 is set to a ground voltage. The ground line 240 may be set to a reference voltage other than the ground voltage.

Each of the transistors Tr1 and Tr2 is, for example, an N-channel metal oxide semiconductor (NMOS) transistor. The second terminal 232 is connected to a drain of the transistor Tr1, and the third terminal 233 is connected to a drain of the transistor Tr2. Gates of the transistors Tr1 and Tr2 are connected to a word line WL. Sources of the transistors Tr1 and Tr2 are connected to a first bit line BL1 and a second bit line BL2, respectively.

As with the magnetic memory elements 100 and 102 shown in FIGS. 2A and 2B, the magnetic memory element 200 shown in FIG. 13 is fabricated by annealing at a predetermined temperature after deposition of all layers of a multilayer film including the heavy metal layer 220 and the magnetoresistance element 210. The roughness of the interface between the free layer 212 and the heavy metal layer 220 is preferably 1.0 nm or less, more preferably 0.6 nm or less.

Data "0" and "1" are allocated to the magnetoresistance element 210 according to resistance states. For example, when the magnetic order of the reference layer 216 and the magnetic order of the free layer 212 are oriented in the same direction (parallel state), the magnetoresistance element 210 is in a low-resistance state. When they are oriented in the opposite directions (anti-parallel state), the magnetoresistance element 210 is in a high-resistance state. It is therefore possible to determine the former data to be "0" and the latter data to be "1."

To write data into the magnetoresistance element 210, a weak bias field is applied in a direction of a write current $I_{write}$, the word line WL is set to high level to turn on the transistors Tr1 and Tr2, one of the first bit line BL1 and the second bit line BL2 is set to high level, and the other bit line is set to low level. With these settings, the write current $I_{write}$ flows through the heavy metal layer 220 in an in-plane direction between the first bit line BL1 and the second bit line BL2 to generate a spin current, which induces an SOT to allow reversal of the magnetic order of the free layer 212 and thereby write the data. Data to be written can be changed depending on the direction of the write current $I_{write}$.

To read out data stored in the magnetoresistance element 210, the word line WL is set to high level to turn on the transistors Tr1 and Tr2, one of the bit lines (second bit line BL2) is set to high level, and the other bit line (first bit line BL1) is set to an open state. With these settings, a read current $I_{read}$ flows from the second bit line BL2 in high level into the ground line 240 through the third terminal 233, the heavy metal layer 220, the free layer 212, the non-magnetic layer 214, the reference layer 216, and the first terminal 231. By measuring the magnitude of the read current $I_{read}$ by a magnetoresistance effect, it is possible to determine the resistance state of the magnetoresistance element 210, i.e., the stored data.

As described above, the interface between the free layer 212 and the heavy metal layer 220 is smoothed, which makes it possible to enhance a readout signal from the magnetic memory element 200.

Figure 14:
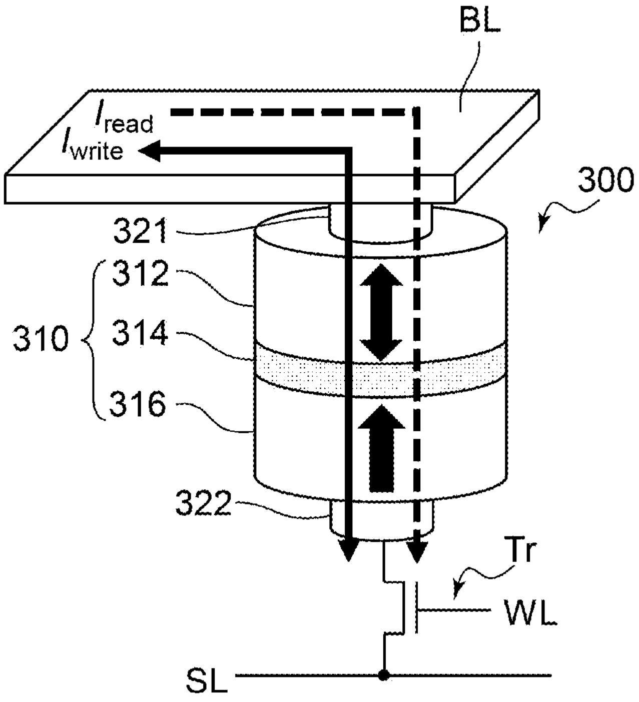
FIG. 14 is a schematic view of a configuration of a magnetic memory element for an STT-MRAM.

FIG. 14 shows a configuration of a magnetic memory element 300 for an STT-MRAM in which a magnetic order is reversed by a spin transfer torque (STT). The magnetic memory element 300 includes a magnetoresistance element 310, a first terminal 321, a second terminal 322, and a transistor Tr.

The magnetoresistance element 310 includes a reference layer 316 whose magnetic order is fixed in an out-of-plane direction, a non-magnetic layer 314 on the reference layer 316, and a free layer 312 which is in contact with the non-magnetic layer 314 and whose magnetic order can be reversed.

The free layer 312 is a thin film made of a canted antiferromagnet as with the antiferromagnetic layer 110 shown in FIGS. 2A and 2B. The non-magnetic layer 314 is made of an insulating material (e.g., MgO). The reference layer 316 is made of a ferromagnet (e.g., CoFeB). The magnetoresistance element 310 also serves as an MTJ element.

The first terminal 321 and the second terminal 322 are made of a metal. The free layer 312 is connected to the first terminal 321, and the reference layer 316 is connected to the second terminal 322. The first terminal 321 is connected to a bit line BL, and the second terminal 322 is connected to the transistor Tr.

The transistor Tr is, for example, an NMOS transistor. The transistor Tr has a drain connected to the second terminal 322, a source connected to a source line SL, and a gate connected to a word line WL.

As with the magnetic memory elements 100 and 102 shown in FIGS. 2A and 2B, the magnetic memory element 300 shown in FIG. 14 is fabricated by annealing at a predetermined temperature after deposition of all layers of a multilayer film including the magnetoresistance element 310 and the first terminal 321. The roughness of the interface between the free layer 312 and the non-magnetic layer 314 and the roughness of the interface between the free layer 312 and the first terminal 321 are preferably 1.0 nm or less, more preferably 0.6 nm or less. As with the magnetoresistance element 210 shown in FIG. 13, data "0" and "1" are allocated to the magnetoresistance element 310 according to resistance states.

To write data into the magnetoresistance element 310, the word line WL is set to high level to turn on the transistor Tr, and a write current $I_{write}$ flows in an out-of-plane direction between the bit line BL and the source line SL. This induces an STT to allow reversal of the magnetic order of the free layer 312 and thereby write the data. Data to be written can be changed depending on the direction of the write current $I_{write}$.

To read out data stored in the magnetoresistance element 310, the word line WL is set to high level to turn on the transistor Tr, and a read current $I_{read}$ flows between the bit line BL and the source line SL. By measuring the magnitude of the read current $I_{read}$ by the magnetoresistance effect, it is possible to determine the resistance state of the magnetoresistance element 310, i.e., the stored data.

As described above, the interface between the free layer 312 and a contact layer (i.e., the non-magnetic layer 314 or the first terminal 321) is smoothed, which makes it possible to enhance a readout signal from the magnetic memory element 300.

Although MTJ elements are shown as examples of the magnetoresistance elements 210 and 310 in FIGS. 13 and 14, these magnetoresistance elements can serve as giant magnetoresistance (GMR) elements as well. In this case, the non-magnetic layers 214 and 314 are made of a metal (conductor).

The invention is not limited to the above-described embodiments, and various modifications can be made without departing from the scope of the invention.

For example, although $Mn_3Sn$ is given as an example of the canted antiferromagnet in the above-described embodiments, other canted antiferromagnets with a composition of $Mn_3X$ (X=Sn, Ge, Ga, Rh, Pt, Ir, and so on), $Mn_3YN$ (Y=Sn, Ni, Ga), $Mn_5Si_3$, $RuO_2$, and so on, may also be employed in the embodiments.

REFERENCE SIGN LIST

2: Substrate
100, 102, 200, 300: Magnetic memory element
110: Antiferromagnetic layer
120: Heavy metal layer
130: Oxide layer
152, 154, 162, 164: Electrode
210, 310: Magnetoresistance element
212, 312: Free layer
214, 314: Non-magnetic layer
216, 316: Reference layer
220: Heavy metal layer

The invention claimed is:

1. A magnetic memory element comprising:
an antiferromagnetic layer made of a canted antiferromagnet having a magnetic order with a canted magnetic moment; and
a contact layer in contact with the antiferromagnetic layer and made of a different material from the canted antiferromagnet, wherein
a roughness of an interface between the antiferromagnetic layer and the contact layer is 1.0 nm or less, and
when a write current flows through the contact layer in an in-plane direction or the write current flows through the contact layer and the antiferromagnetic layer in an out-of-plane direction, spin torque is generated to act on the magnetic order of the antiferromagnetic layer, thereby allowing reversal of the magnetic order.

2. The magnetic memory element according to claim 1, wherein
the canted antiferromagnet is configured to exhibit an anomalous Hall effect.

3. The magnetic memory element according to claim 1, wherein
the canted antiferromagnet has a spin order of a cluster magnetic octupole.

4. The magnetic memory element according to claim 1, wherein
the antiferromagnetic layer has the magnetic order in an out-of-plane direction.

5. The magnetic memory element according to claim 1, wherein
the roughness of the interface is 0.6 nm or less.

6. The magnetic memory element according to claim 1, wherein
the contact layer is made of a material that exhibits a spin Hall effect,
the write current flowing through the contact layer in the in-plane direction is configured to generate a spin current, and
the spin current is configured to induce a spin-orbit torque to act on the magnetic order of the antiferromagnetic layer, thereby allowing reversal of the magnetic order.

7. The magnetic memory element according to claim 1, wherein
the write current flowing through the contact layer and the antiferromagnetic layer in the out-of-plane direction is configured to induce a spin transfer torque that allows reversal of the magnetic order of the antiferromagnetic layer.

8. A method for fabricating the magnetic memory element according to claim 1, the method comprising:

depositing a multilayer film including the antiferromagnetic layer and the contact layer at room temperature; and annealing the multilayer film at not less than crystallization temperature of the antiferromagnetic layer after deposition of all layers of the multilayer film, thereby smoothing the interface between the antiferromagnetic layer and the contact layer.

9. The method according to claim 8, wherein the depositing of the multilayer film comprises:

depositing the antiferromagnetic layer on a substrate at room temperature;

depositing the contact layer on the antiferromagnetic layer at room temperature; and depositing an oxide layer made of a metal oxide on the contact layer at room temperature.

10. A method for writing data to the magnetic memory element according to claim 1, the method comprising:

applying a write current in at least one of (i) an in-plane direction through the contact layer to generate a spin current configured to induce a spin-orbit torque acting on the magnetic order of the antiferromagnetic layer, and (ii) an out-of-plane direction through the contact layer and the antiferromagnetic layer to induce a spin transfer torque, thereby allowing reversal of the magnetic order.

* * * * *